United States Patent
Fujiyoshi

(10) Patent No.: US 12,433,108 B2
(45) Date of Patent: Sep. 30, 2025

(54) DISPLAY APPARATUS INCLUDING THROUGH PORTIONS PENETRATING BARRIER LAYERS

(71) Applicant: JOLED INC., Tokyo (JP)

(72) Inventor: Jun Fujiyoshi, Tokyo (JP)

(73) Assignee: JDI DESIGN AND DEVELOPMENT G.K., Tokyo (JP)

(*) Notice: Subject to any disclaimer, the term of this patent is extended or adjusted under 35 U.S.C. 154(b) by 479 days.

(21) Appl. No.: 17/653,350

(22) Filed: Mar. 3, 2022

(65) Prior Publication Data
US 2022/0293871 A1    Sep. 15, 2022

(30) Foreign Application Priority Data
Mar. 9, 2021    (JP) .................................. 2021-037800

(51) Int. Cl.
*H10K 59/123*    (2023.01)
*H10K 50/844*    (2023.01)
(Continued)

(52) U.S. Cl.
CPC ......... *H10K 59/123* (2023.02); *H10K 50/844* (2023.02); *H10K 59/12* (2023.02);
(Continued)

(58) Field of Classification Search
CPC ...... H10K 50/844; H10K 50/15; H10K 50/16; H10K 50/17; H10K 50/171; H10K 50/813;
(Continued)

(56) References Cited

U.S. PATENT DOCUMENTS

2003/0189210 A1* 10/2003 Yamazaki ........... H01L 27/1248
257/E27.113
2005/0110020 A1* 5/2005 Hayashi ............... H10K 59/872
257/E27.111
(Continued)

FOREIGN PATENT DOCUMENTS

JP    2005167215 A    6/2005
JP    2007250244 A    9/2007
(Continued)

OTHER PUBLICATIONS

Office Action for JP patent application No. 2021-037800 dated on Nov. 26, 2024.
(Continued)

*Primary Examiner* — Ida M Soward
(74) *Attorney, Agent, or Firm* — CHIP Law Group

(57) ABSTRACT

A display apparatus includes a flexible first substrate, a first lower barrier layer, a thin film transistor layer, a first planarization layer, a first barrier layer, a first electrode, a second electrode, and a light emitting layer. In the display apparatus, a first through portion penetrating the first planarization layer is formed on the first planarization layer, a second through portion penetrating the first barrier layer and at least partially connected to the first through portion is formed on the first barrier layer, part of the first electrode fills the first through portion and the second through portion, and an area of the second through portion is equal to or greater than 30% of an area of the first electrode in plan view of the main surface of the first substrate.

6 Claims, 12 Drawing Sheets

(51) Int. Cl.
    *H10K 59/12*    (2023.01)
    *H10K 77/10*    (2023.01)
    *H10K 50/15*    (2023.01)
    *H10K 50/16*    (2023.01)
    *H10K 50/17*    (2023.01)
    *H10K 59/122*    (2023.01)
    *H10K 102/00*    (2023.01)

(52) U.S. Cl.
    CPC ............ *H10K 77/111* (2023.02); *H10K 50/15* (2023.02); *H10K 50/16* (2023.02); *H10K 50/17* (2023.02); *H10K 50/171* (2023.02); *H10K 59/122* (2023.02); *H10K 2102/311* (2023.02)

(58) Field of Classification Search
    CPC .... H10K 59/123; H10K 59/12; H10K 59/122; H10K 77/111; H10K 2102/311; H01L 27/1218; H01L 27/124; H01L 27/1248; H10D 86/411; H10D 86/441; H10D 86/451; H10D 86/60
    See application file for complete search history.

(56) References Cited

U.S. PATENT DOCUMENTS

| | | |
|---|---|---|
| 2005/0116231 A1 | 6/2005 | Kang et al. |
| 2005/0186698 A1* | 8/2005 | Ishida ................. H10K 59/122 |
| | | 438/99 |
| 2008/0036705 A1 | 2/2008 | Iwashita et al. |
| 2008/0143249 A1* | 6/2008 | Lee ...................... H10K 50/826 |
| | | 313/504 |
| 2010/0176717 A1 | 7/2010 | Lee et al. |
| 2011/0199564 A1 | 8/2011 | Moriwaki |
| 2014/0092354 A1 | 4/2014 | Moriwaki |
| 2015/0340418 A1 | 11/2015 | Moriwaki |
| 2017/0288168 A1* | 10/2017 | Kim ....................... H10K 59/12 |
| 2018/0190739 A1* | 7/2018 | Paek ................... H10K 59/122 |
| 2020/0235194 A1* | 7/2020 | Ito ..................... H10K 50/8426 |
| 2020/0243635 A1* | 7/2020 | Lee ..................... H10K 59/126 |
| 2020/0403047 A1 | 12/2020 | Oh et al. |
| 2021/0057504 A1* | 2/2021 | Ko .......................... H10K 71/00 |

FOREIGN PATENT DOCUMENTS

| | | | | |
|---|---|---|---|---|
| JP | 2010117547 A | | 5/2010 | |
| JP | 2016024887 A | | 2/2016 | |
| JP | 2020204770 A | | 12/2020 | |
| KR | 20110080885 A | * | 7/2011 | ............ H10D 86/60 |
| WO | 2010038514 A1 | | 4/2010 | |

OTHER PUBLICATIONS

Office Action issued for the corresponding JP patent application No. 2021-037800, mailed on Mar. 18, 2025.

* cited by examiner

DISPLAY APPARATUS INCLUDING THROUGH PORTIONS PENETRATING BARRIER LAYERS

CROSS REFERENCE TO RELATED APPLICATIONS

The present disclosure contains subject matter related to that disclosed in Japanese Priority Patent Application JP 2021-037800 filed in the Japan Patent Office on Mar. 9, 2021, the entire content of which is hereby incorporated by reference.

BACKGROUND

The present disclosure relates to a display apparatus.

In recent years, a display apparatus with a flexible substrate formed from an organic material, such as plastics, has been proposed. The display apparatus includes, for example, an organic electro-luminescence (EL) element as a light emitting element. The organic EL element may be degraded by infiltration of moisture. Particularly, when a substrate formed from an organic material is used, it is more difficult to suppress the infiltration of moisture into the substrate than in a case of using a substrate formed from an inorganic material such as glass. Therefore, the moisture may infiltrate the organic EL element from the substrate side.

In an image display apparatus described in Japanese Patent Laid-Open No. 2016-24887, an inorganic insulating film is arranged between a light emitting layer included in an organic EL element and an organic planarization film covering a thin film transistor to thereby suppress infiltration of moisture from the organic planarization film to the light emitting layer.

SUMMARY

However, in the image display apparatus described in Japanese Patent Laid-Open No. 2016-24887, gas is generated in the organic planarization film when the organic planarization film is heated in forming an electrode film to be arranged on the upper surface of the inorganic insulating film. The gas unable to go through the inorganic insulating film stays in the organic planarization film, and stress is applied to the inorganic insulating film. Therefore, the inorganic insulating film may be peeled off from the organic planarization film.

The present disclosure has been made to solve the problem, and the present disclosure provides a display apparatus that can suppress moisture to a light emitting layer and suppress stress generated in a layered structure.

According to an embodiment of the present disclosure, there is provided a display apparatus including a flexible first substrate, a first lower barrier layer arranged above one main surface of the first substrate and formed from an inorganic material, a thin film transistor layer arranged above the first lower barrier layer and including a thin film transistor, a first planarization layer arranged above the thin film transistor layer and formed from an organic material, a first barrier layer arranged above the first planarization layer and formed from an inorganic material, a first electrode arranged above the first barrier layer, a second electrode arranged above the first electrode, and a light emitting layer arranged between the first electrode and the second electrode and supplied with current through the first electrode and the second electrode to emit light, in which a first through portion penetrating the first planarization layer is formed on the first planarization layer, a second through portion penetrating the first barrier layer and at least partially connected to the first through portion is formed on the first barrier layer, part of the first electrode fills the first through portion and the second through portion, and an area of the second through portion is equal to or greater than 30% of an area of the first electrode in plan view of the main surface of the first substrate.

According to another embodiment of the present disclosure, there is provided a display apparatus including a flexible first substrate, a first lower barrier layer arranged above one main surface of the first substrate and formed from an inorganic material, a thin film transistor layer arranged above the first lower barrier layer and including a thin film transistor, a first planarization layer arranged above the thin film transistor layer and formed from an organic material, a first barrier layer arranged above the first planarization layer and formed from an inorganic material, a first electrode arranged above the first barrier layer, a second electrode arranged above the first electrode, a light emitting layer arranged between the first electrode and the second electrode and supplied with current through the first electrode and the second electrode to emit light, a second planarization layer arranged between the thin film transistor layer and the first planarization layer and formed from an organic material, a second barrier layer arranged between the second planarization layer and the first planarization layer and formed from an inorganic material, and a relay electrode arranged between the second barrier layer and the first planarization layer, in which a first through portion penetrating the first planarization layer is formed on the first planarization layer, a second through portion penetrating the first barrier layer and at least partially connected to the first through portion is formed on the first barrier layer, a third through portion penetrating the second planarization layer is formed on the second planarization layer, a fourth through portion penetrating the second barrier layer and at least partially connected to the third through portion is formed on the second barrier layer, part of the first electrode fills the first through portion and the second through portion, part of the relay electrode fills the third through portion and the fourth through portion, at least part of the fourth through portion is arranged at a position different from that of the second through portion in plan view of the main surface of the first substrate, and the relay electrode is electrically connected to the first electrode at the first through portion.

According to the present disclosure, a display apparatus that can suppress infiltration of moisture into a light emitting layer and suppress stress generated in a layered structure can be provided.

DETAILED DESCRIPTION OF THE PREFERRED EMBODIMENTS

Figure 1:
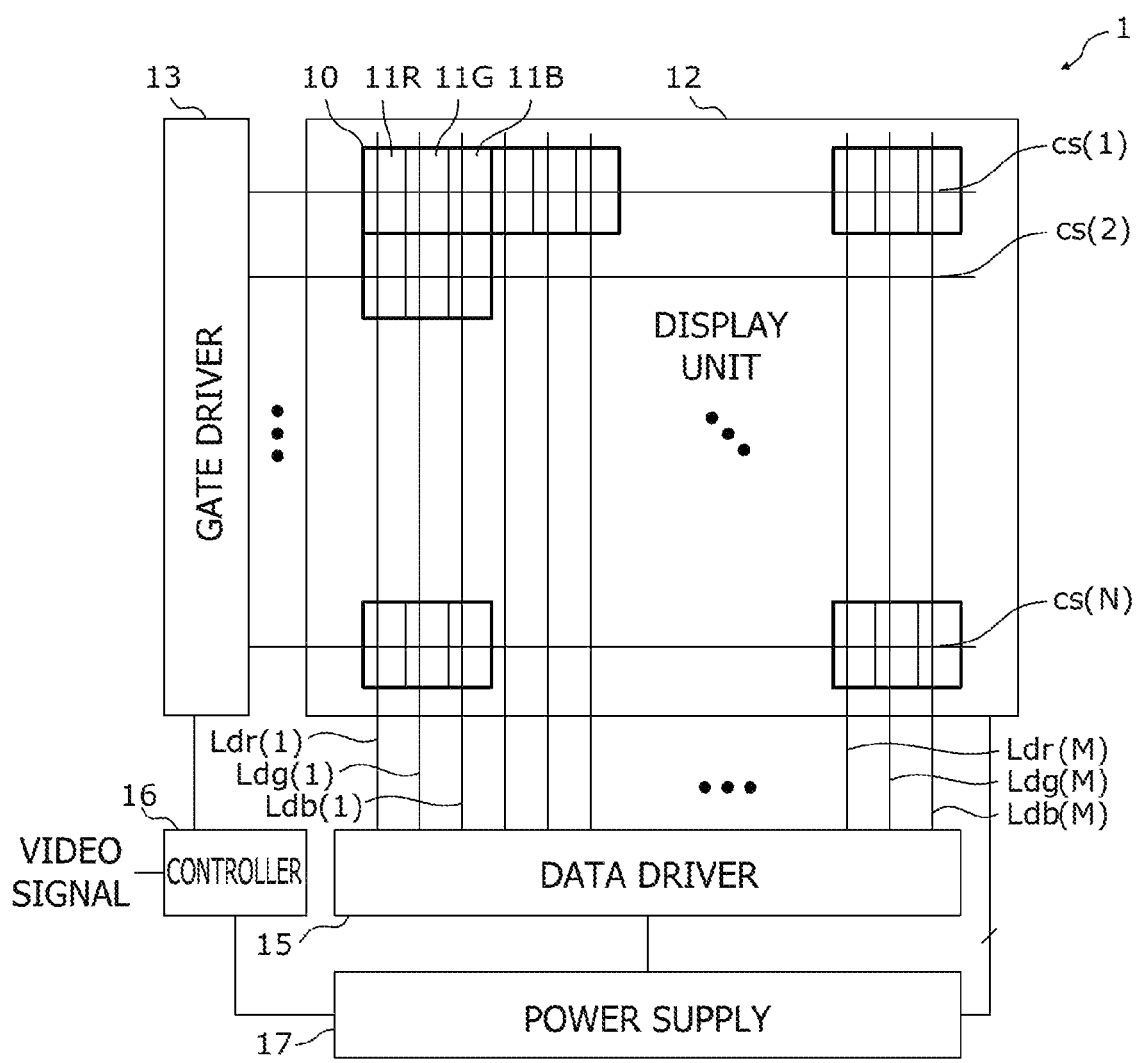
FIG. 1 is a block diagram illustrating an example of an overall configuration of a display apparatus according to a first embodiment.

Embodiments of the present disclosure will now be described with reference to the drawings. Note that each of the embodiments described below illustrates a specific example of the present disclosure. Therefore, values, shapes, materials, constituent elements, arrangement positions and connection modes of the constituent elements, steps, and orders of the steps illustrated in the following embodiments are examples and are not intended to limit the present disclosure. Thus, the constituent elements not described in the independent claims representing the highest level concept of the present disclosure among the constituent elements in the following embodiments are described as optional constituent elements.

The drawings are schematic diagrams, and the drawings may not be exactly depicted. Therefore, the reduced scales etc. may not coincide with each other in the drawings. Note that, in the drawings, the same signs are provided to substantially the same components, and duplicate description will be omitted or simplified.

In the present specification, terms "above" and "below" do not represent an upper direction (vertically above) and a lower direction (vertically below) in absolute spatial perception. The terms are used as terms defined by a relative positional relation on the basis of the order of layers in a layered configuration. The terms "above" and "below" are applied not only to a case in which another constituent element exists between two constituent elements spaced apart from each other, but also to a case in which two constituent elements are arranged in contact with each other.

First Embodiment

A display apparatus according to a first embodiment will be described.

1-1. Overall Configuration

An overall configuration of the display apparatus according to the present embodiment will be described with reference to FIG. 1. FIG. 1 is a block diagram illustrating an example of the overall configuration of a display apparatus 1 according to the present embodiment.

The display apparatus 1 according to the present embodiment includes a display unit 12, a gate driver 13, a data driver 15, a controller 16, and a power supply 17 as illustrated in FIG. 1. In the present embodiment, the display apparatus 1 is an active-matrix color display apparatus.

The display unit 12 is an image display unit including a plurality of pixels 10 arranged in a matrix. Each of the plurality of pixels 10 includes at least one subpixel. In the present embodiment, each of the plurality of pixels 10 includes subpixels 11R, 11G, and 11B corresponding to emission colors of R, G, and B, respectively. Each of the plurality of pixels 10 includes a pixel circuit that controls the light emission of the pixel. Each pixel circuit includes one or more subpixel circuits. Each of the subpixels 11R, 11G, and 11B includes a subpixel circuit that controls the light emission of the subpixel.

The display unit 12 includes at least one control signal line cs(i) (i is an integer equal to or greater than 1 but equal to or smaller than N; N is an integer greater than 1 indicating the number of rows in the matrix) connected to the pixel circuits included in the plurality of pixels 10 arranged on each row of the matrix. The control signal line cs(i) transmits a control signal supplied from the gate driver 13 to the pixels 10.

The display unit 12 includes three data signal lines Ldr(j), Ldg(j), and Ldb(j) (j is an integer equal to or greater than 1 but equal to or smaller than M; M is an integer greater than 1 indicating the number of columns in the matrix) connected to the pixel circuits of the plurality of pixels 10 arranged on each column of the matrix. The data signal lines Ldr(j), Ldg(j), and Ldb(j) transmit data signals related to the light emission luminance of R, G, and B supplied from the data driver 15 to the pixel circuits of the pixels 10, respectively.

The controller 16 receives a video signal from the outside and supplies the gate driver 13 and the data driver 15 with a signal for the display unit 12 to display an image of each frame corresponding to the video signal.

The gate driver 13 is a circuit that outputs a control signal to the display unit 12 on the basis of a signal from the controller 16. The gate driver 13 sequentially outputs one drive pulse in each horizontal period.

The data driver 15 is a circuit that outputs a data signal to the display unit 12 on the basis of a signal from the controller 16.

The power supply 17 supplies electric power or other power to the display unit 12, the gate driver 13, the data driver 15, and the controller 16.

1-2. Configuration of Subpixel

Figure 2:
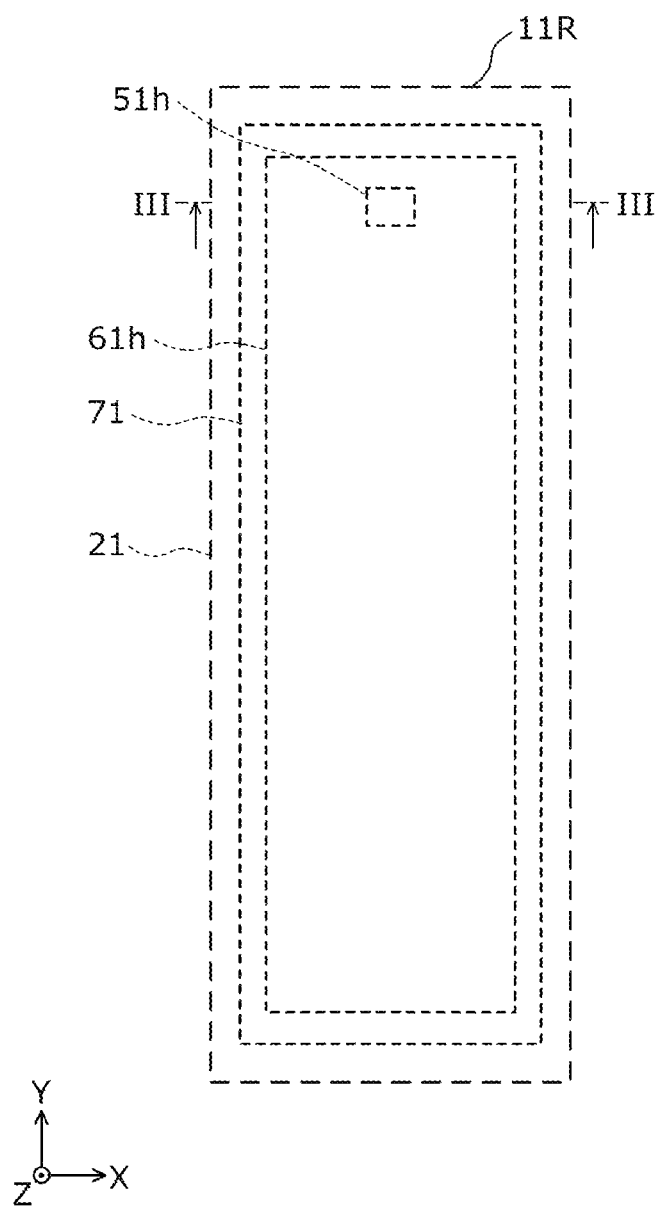
FIG. 2 is a schematic plan view illustrating an example of a configuration of a subpixel according to the first embodiment.
Figure 3:
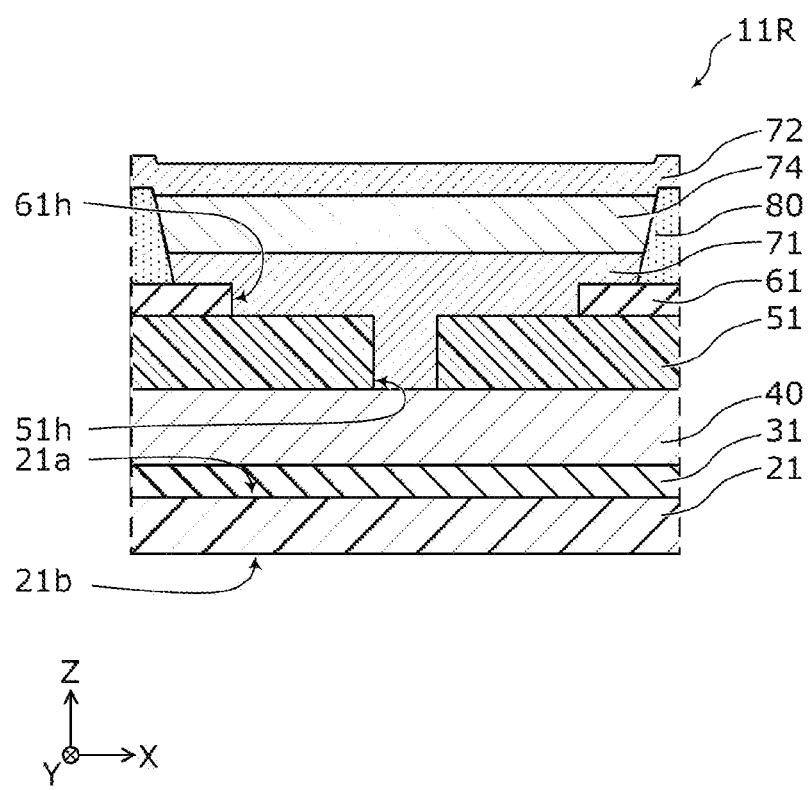
FIG. 3 is a schematic cross-sectional view illustrating a layered structure of the subpixel according to the first embodiment.

A configuration of the subpixel 11R will be described with reference to FIGS. 2 and 3. FIG. 2 is a schematic plan view illustrating an example of the configuration of the subpixel 11R according to the present embodiment. FIG. 2 is a plan view of the subpixel 11R as viewed in plan from a main surface 21a of a first substrate 21 described later. FIG. 2 illustrates dashed lines representing a contour of a first electrode 71 included in the subpixel 11R and contours of a first through portion 51h and a second through portion 61h. FIG. 3 is a schematic cross-sectional view illustrating a layered structure of the subpixel 11R according to the present embodiment. FIG. 3 illustrates a cross section along a line III-III in FIG. 2. Note that each of FIG. 2 and subsequent drawings illustrates an X-axis, a Y-axis, and a Z-axis. The X-axis, the Y-axis, and the Z-axis represent a right-handed Cartesian coordinate system. The subpixels 11R, 11G, and 11B included in the pixel 10 have the same configuration in the present embodiment. The configuration of the pixel 10 will be described with a focus on the subpixel 11R.

As illustrated in FIG. 3, the subpixel 11R of the display apparatus 1 according to the present embodiment includes the first substrate 21, a first lower barrier layer 31, a thin film transistor layer 40, a first planarization layer 51, a first barrier layer 61, the first electrode 71, a light emitting layer 74, and a second electrode 72. In the present embodiment, the subpixel 11R further includes a bank 80.

The first substrate 21 is a flexible plate-shaped member as a base of the subpixel 11R. The first substrate 21 includes main surfaces 21a and 21b. A substrate containing, for example, a polyimide resin of aromatic polyimide or fluorinated polyimide, an acrylic resin, or other organic material can be used for the first substrate 21.

The first lower barrier layer 31 is an insulating layer arranged above one main surface 21a of the first substrate 21 and formed from an inorganic material. An inorganic material film, such as silicon oxide ($SiO_x$), silicon nitride ($SiN_x$), and aluminum oxide ($AlxO_y$), can be used for the first lower barrier layer 31. The first lower barrier layer 31 can suppress infiltration of moisture from the first substrate 21 to the light emitting layer 74.

The thin film transistor layer 40 is a layer arranged above the first lower barrier layer 31, and a circuit including a thin film transistor etc. is formed. The thin film transistor layer 40 includes main parts of the subpixel circuit. The thin film transistor layer 40 includes, for example, a semiconductor layer including an oxide semiconductor etc., an insulating layer, and a conductive layer.

The first planarization layer 51 is an insulating layer arranged above the thin film transistor layer 40 and formed from an organic material. The first through portion 51h penetrating the first planarization layer 51 is formed on the first planarization layer 51. The first planarization layer 51 is formed from, for example, a polyimide resin of fluorinated polyimide etc., an acrylic resin, or other organic materials.

The first barrier layer 61 is an insulating layer arranged above the first planarization layer 51 and formed from an inorganic material. An inorganic material film, such as silicon oxide, silicon nitride, and aluminum oxide, can be used for the first barrier layer 61. The first barrier layer 61 suppresses infiltration of moisture from the first planarization layer 51 and layers below the first planarization layer 51 to the light emitting layer 74.

The second through portion 61h penetrating the first barrier layer 61 and at least partially connected to the first through portion 51h is formed on the first barrier layer 61. In this way, although the second through portion 61h is formed on the first barrier layer 61, part of the first electrode 71 fills the second through portion 61h. This can suppress the infiltration of moisture into the light emitting layer 74 through the second through portion 61h.

As illustrated in FIG. 2, the area of the second through portion 61h is equal to or greater than 30% of the area of the first electrode 71 in plan view of the main surface 21a of the first substrate 21. The area of the second through portion 61h may be equal to or greater than 50% of the area of the first electrode 71. The area of the second through portion 61h may be equal to or greater than 70% of the area of the first electrode 71. The effect produced by the relation between the area of the second through portion 61h and the area of the first electrode 71 will be described later.

The first electrode 71 is a conductive layer arranged above the first barrier layer 61. The first electrode 71 and the second electrode 72 function as electrodes that supply current to the light emitting layer 74. In the present embodiment, the first electrode 71 is an anode to which potential higher than the second electrode 72 is applied. The first electrode 71 is also arranged on the first through portion 51h and the second through portion 61h. In other words, part of the first electrode 71 fills the first through portion 51h and the second through portion 61h. In the present embodiment, the first electrode 71 is electrically connected to the conductive layer included in the thin film transistor layer 40 through the first through portion 51h and the second through portion 61h. In this way, the first through portion 51h and the second through portion 61h function as contact holes. The first electrode 71 is formed from, for example, a metal material, such as an Ag alloy and Al, with high reflectance of light generated in the light emitting layer 74. In this way, the light generated in the light emitting layer 74 can be efficiently used.

The second electrode 72 is a conductive layer arranged above the first electrode 71. The second electrode 72 functions as an electrode that supplies current to the light emitting layer 74. In the present embodiment, the second electrode 72 is a cathode to which potential lower than the first electrode 71 is applied. The second electrode 72 is formed from, for example, a conductive material, such as indium tin oxide (ITO), that transmits light generated in the light emitting layer 74.

The light emitting layer 74 is a layer arranged between the first electrode 71 and the second electrode 72 and supplied with current through the first electrode 71 and the second electrode 72 to emit light. The light emitting layer 74 includes, for example, a hole injection layer, a hole transport layer, an organic EL layer, an electron transport layer, an electron injection layer, etc. In this way, an organic EL element can be formed by the light emitting layer 74, the first electrode 71, and the second electrode 72. Note that the light emitting layer 74 may include an inorganic material layer. Although the light emitting layer 74 is arranged in a region surrounded by the bank 80 in the present embodiment, the light emitting layer 74 may also be arranged above the bank 80.

The bank 80 is a wall-shaped insulating layer that defines the pixel 10 and the subpixels 11R, 11G, and 11B. In other words, the bank 80 is arranged on a boundary between adjacent subpixels. The bank 80 is formed by using, for example, a fluorinated polyimide material, an acrylic material, a phenol formaldehyde resin, etc. The first electrode 71 and the light emitting layer 74 are arranged in the region surrounded by the bank 80. Note that the second electrode 72 is arranged above the light emitting layer 74 and the bank 80 as illustrated in FIG. 3. That is, the second electrode 72 is arranged on the entire surface of the region provided with the plurality of pixels 10 in the display unit 12.

Note that other layers etc. may be formed above the second electrode 72. For example, a polarizing plate etc. may be arranged above the second electrode 72. A resin film, an inorganic barrier film, etc. may be arranged between the second electrode 72 and the polarizing plate. An adhesive etc. for bonding the polarizing plate may be arranged between the polarizing plate and the second electrode 72.

1-3. Manufacturing Method

Figure 4:
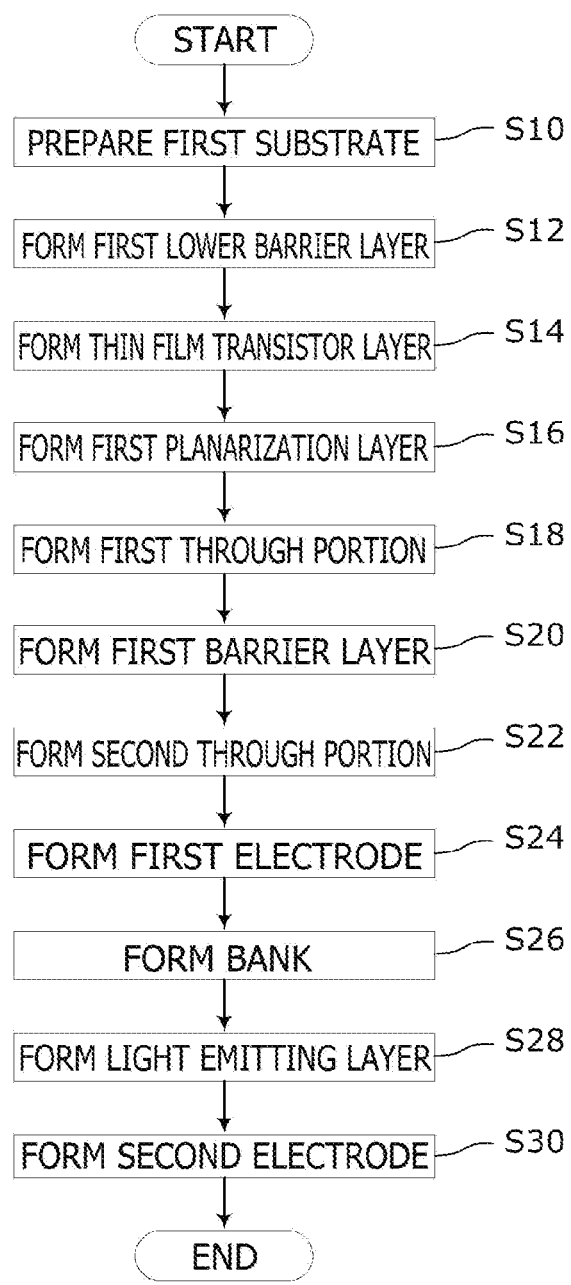
FIG. 4 is a flow chart illustrating a flow of a manufacturing method of the display apparatus according to the first embodiment.

A manufacturing method of the display apparatus 1 according to the present embodiment will be described with reference to FIG. 4. FIG. 4 is a flow chart illustrating a flow of the manufacturing method of the display apparatus 1 according to the present embodiment.

As illustrated in FIG. 4, the first substrate 21 is prepared first (S10).

The first lower barrier layer 31 arranged above the main surface 21a of the first substrate 21 is formed (S12). Specifically, a silicon oxide film, a silicon nitride film, an aluminum oxide film, or other film is deposited as the first lower barrier layer 31 in the regions corresponding to at least the plurality of pixels 10 on the main surface 21a of the first substrate 21. The first lower barrier layer 31 can be formed by using, for example, a plasma chemical vapor deposition (CVD) method, an Atomic Layer Deposition (ALD) method, or other method.

The thin film transistor layer 40 arranged above the first lower barrier layer 31 and including a thin film transistor is formed (S14). Specifically, conductive layers, insulating layers, and semiconductor layers included in the thin film transistor layer 40 are formed. The conductive layers and the semiconductor layers can be formed by using, for example, a sputtering method or other method. The insulating layers can be formed by using, for example, a plasma CVD method or other method. The layers can be patterned by using, for example, a photolithography method, an etching method, or other method.

The first planarization layer 51 arranged above the thin film transistor layer 40 is formed (S16). For example, a solution of a polyimide resin dissolved in a solvent is applied over the thin film transistor layer 40 and is then fired to deposit the first planarization layer 51.

The first through portion 51h penetrating the first planarization layer 51 is formed on the first planarization layer 51 (S18). The first through portion 51h can be formed by using, for example, a photolithography method, an etching method, or other method. Note that the first through portion 51h may be formed at the same time as the formation of the first planarization layer 51. For example, a polyimide resin may be exposed and developed to pattern the first through portion 51h at the same time as the formation of the first planarization layer 51.

The first barrier layer 61 is formed above the first planarization layer 51 (S20). Specifically, a silicon oxide film, a silicon nitride film, an aluminum oxide film, or other film is deposited as the first barrier layer 61 on the first planarization layer 51. The first barrier layer 61 can be formed by using, for example, a plasma CVD method, an ALD method, or other method.

The second through portion 61h penetrating the first barrier layer 61 is formed on the first barrier layer 61 (S22). The second through portion 61h can be formed by using, for example, a photolithography method, an etching method, or other method.

The first electrode 71 is formed above the first barrier layer 61 (S24). Specifically, a sputtering method or other method is used to form a conductive film, such as an Ag alloy film, on the upper surface of the first barrier layer 61 and inside the first through portion 51h and the second through portion 61h, and then a photolithography method, an etching method, or other method is used to pattern the conductive film into a predetermined shape to thereby form the first electrode 71. The first planarization layer 51 near the second through portion 61h is heated when the first electrode 71 is formed. Accordingly, gas is generated from the first planarization layer 51 near the second through portion 61h. The generated gas is confined by the first barrier layer 61 and the first electrode 71, and stress is generated on the first barrier layer 61 near the second through portion 61h. However, the area of the second through portion 61h is equal to or greater than 30% of the area of the first electrode 71 in plan view in the present embodiment, and the stress can be dispersed to a relatively wide range. This can suppress peeling and cracking of the first barrier layer 61 caused by the stress. The first electrode 71 filling the second through portion 61h is formed from a metal material that is unlikely to crack and that has moisture barrier properties higher than those of an inorganic film, such as SiN. This can suppress infiltration of moisture from the second through portion 61h to the light emitting layer 74.

A bank is formed above the first barrier layer 61 (S26). Specifically, a solution of a phenol formaldehyde resin dissolved in a solvent is uniformly applied to the entire surface above the first barrier layer 61, that is, on the first barrier layer 61 and the first electrode 71, and the solution is then exposed and developed to form the bank 80 in a predetermined shape.

The light emitting layer 74 is formed above the first electrode 71 (S28). Specifically, the light emitting layer 74 is formed in the region surrounded by the bank 80. The organic material layers included in the light emitting layer 74 can be formed by using, for example, an inkjet application method (in other words, a print method). Note that part of the light emitting layer 74 may also be formed on the bank 80.

The second electrode 72 is formed above the light emitting layer 74 and the bank 80 (S30). Specifically, a sputtering method or a similar method is used to form the second electrode 72 on the entire surfaces of the light emitting layer 74 and the bank 80.

The manufacturing method can be executed to manufacture the display unit 12 of the display apparatus 1.

1-4. Conclusion

In this way, the display apparatus 1 according to the present embodiment includes the flexible first substrate 21, the first lower barrier layer 31 arranged above one main surface 21a of the first substrate 21 and formed from an inorganic material, the thin film transistor layer 40 arranged above the first lower barrier layer 31 and including a thin film transistor, the first planarization layer 51 arranged above the thin film transistor layer 40 and formed from an organic material, the first barrier layer 61 arranged above the first planarization layer 51 and formed from an inorganic material, the first electrode 71 arranged above the first barrier layer 61, the second electrode 72 arranged above the first electrode 71, and the light emitting layer 74 arranged between the first electrode 71 and the second electrode 72 and supplied with current through the first electrode 71 and the second electrode 72 to emit light. The first through portion 51h penetrating the first planarization layer 51 is formed on the first planarization layer 51. The second through portion 61h penetrating the first barrier layer 61 and at least partially connected to the first through portion 51h is formed on the first barrier layer 61. Part of the first electrode 71 fills the first through portion 51h and the second through portion 61h. The area of the second through portion 61h is equal to or greater than 30% of the area of the first electrode 71 in plan view of the main surface 21a of the first substrate 21.

In this way, the first barrier layer 61 is arranged below the light emitting layer 74, and the first electrode 71 fills the second through portion 61h formed on the first barrier layer 61. This can suppress the infiltration of moisture from a portion below the first barrier layer 61 to the light emitting layer 74. The first planarization layer 51 near the second through portion 61*h* is heated when the first electrode 71 is formed. Accordingly, gas is generated from the first planarization layer 51 near the second through portion 61*h*. The generated gas is confined by the first barrier layer 61, and stress is generated on the first barrier layer 61 near the second through portion 61*h*. In related art, the area of the part of the second through portion 61*h* penetrating the first barrier layer 61 is approximately several percent of the area of the first electrode 71 in plan view in order to cover a wider area of the first barrier layer 61 for the moisture barrier while securing the requested contact resistance value. Therefore, the stress is applied near the second through portion 61*h* of the first barrier layer 61, and the first barrier layer 61 may be peeled off. However, the area of the part of the second through portion 61*h* penetrating the first barrier layer 61 is equal to or greater than 30% of the area of the first electrode 71 in plan view in the present embodiment, and the stress can be dispersed to a relatively wide range. This can suppress the peeling and cracking of the first barrier layer 61 caused by the stress.

Second Embodiment

Figure 5:
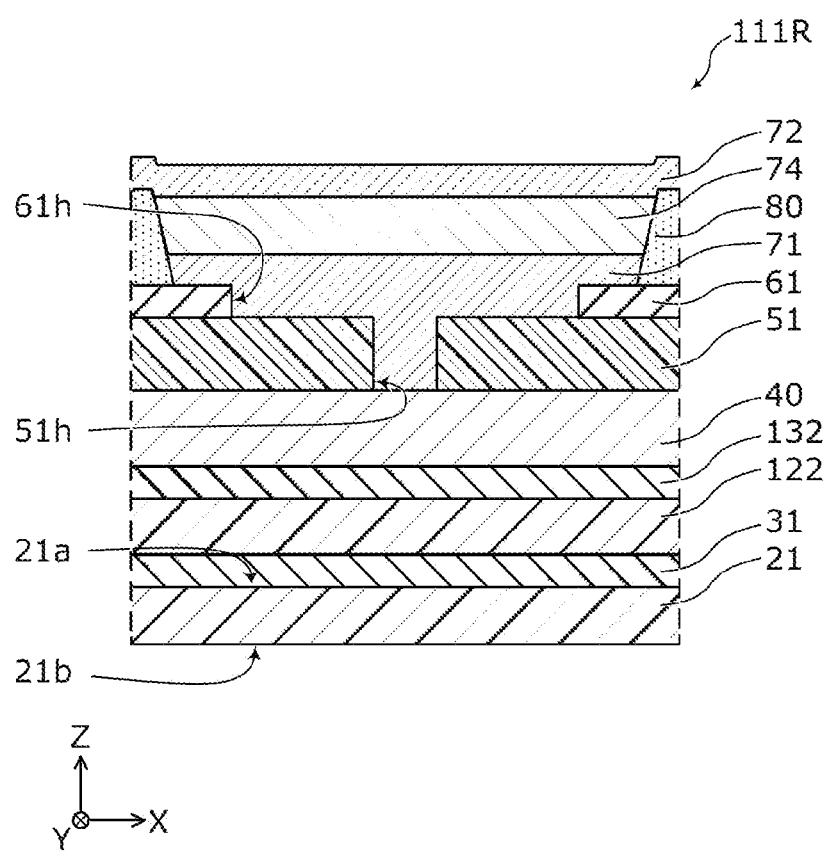
FIG. 5 is a schematic cross-sectional view illustrating a layered structure of a subpixel of a display apparatus according to a second embodiment.

A display apparatus according to a second embodiment will be described. The display apparatus according to the present embodiment is different from the display apparatus 1 according to the first embodiment in that the display apparatus further includes another barrier layer below the thin film transistor layer 40 in addition to the first lower barrier layer 31. The configuration of the display apparatus according to the present embodiment different from the configuration of the display apparatus 1 according to the first embodiment will be mainly described with reference to FIG. 5. FIG. 5 is a schematic cross-sectional view illustrating a layered structure of a subpixel 111R of the display apparatus according to the present embodiment.

As illustrated in FIG. 5, the subpixel 111R according to the present embodiment includes the first substrate 21, the first lower barrier layer 31, the thin film transistor layer 40, the first planarization layer 51, the first barrier layer 61, the first electrode 71, the light emitting layer 74, the second electrode 72, and the bank 80, similarly to the subpixel 11R according to the first embodiment. In the present embodiment, the subpixel 111R further includes a second substrate 122 and a second lower barrier layer 132.

The second substrate 122 is a flexible plate-shaped member arranged between the first lower barrier layer 31 and the thin film transistor layer 40. A substrate containing, for example, a polyimide resin of fluorinated polyimide, an acrylic resin, or other organic material can be used for the second substrate 122.

The second lower barrier layer 132 is an insulating layer arranged between the second substrate 122 and the thin film transistor layer 40 and formed from an inorganic material. An inorganic material film, such as silicon oxide, silicon nitride, and aluminum oxide, can be used for the second lower barrier layer 132.

In this way, the display apparatus according to the present embodiment includes the second lower barrier layer 132 in addition to the first lower barrier layer 31. As a result, even when there is a crack etc. in one of the first lower barrier layer 31 and the second lower barrier layer 132, the other barrier layer can suppress the infiltration of moisture from the first substrate 21 to the light emitting layer 74. This can more surely suppress the infiltration of moisture into the light emitting layer 74.

Third Embodiment

Figure 6:
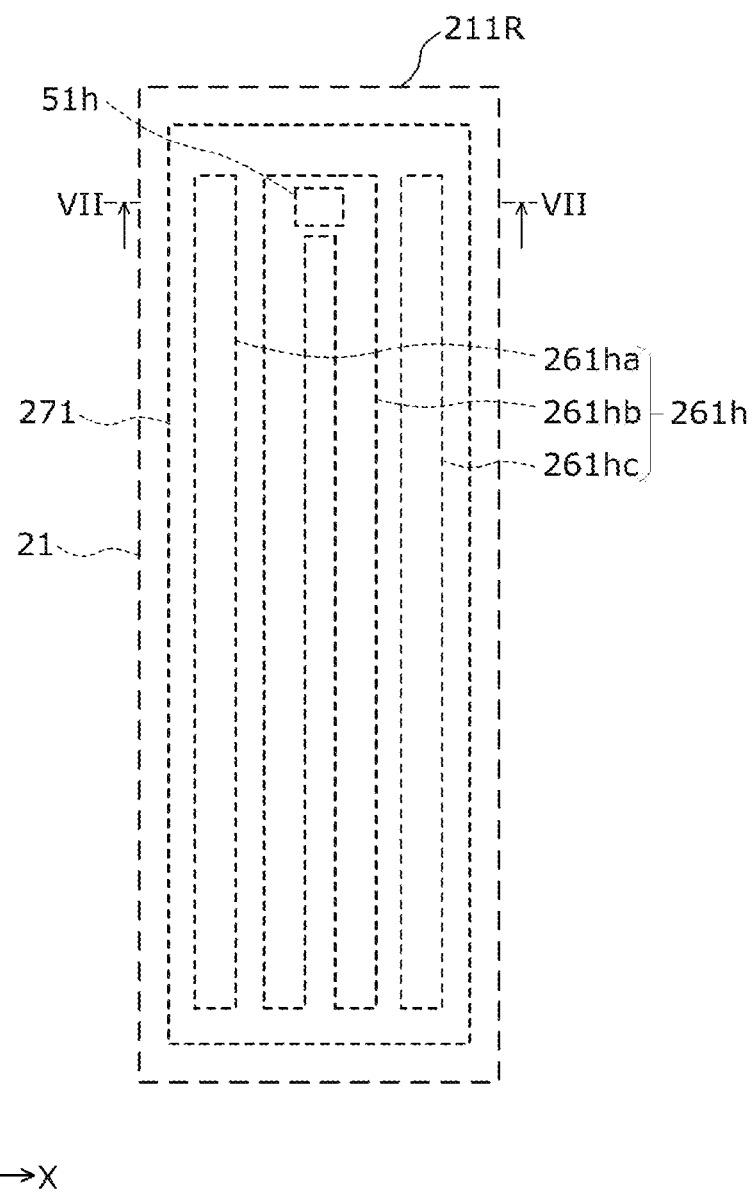
FIG. 6 is a schematic plan view illustrating an example of a configuration of a subpixel in a display apparatus according to a third embodiment.
Figure 7:
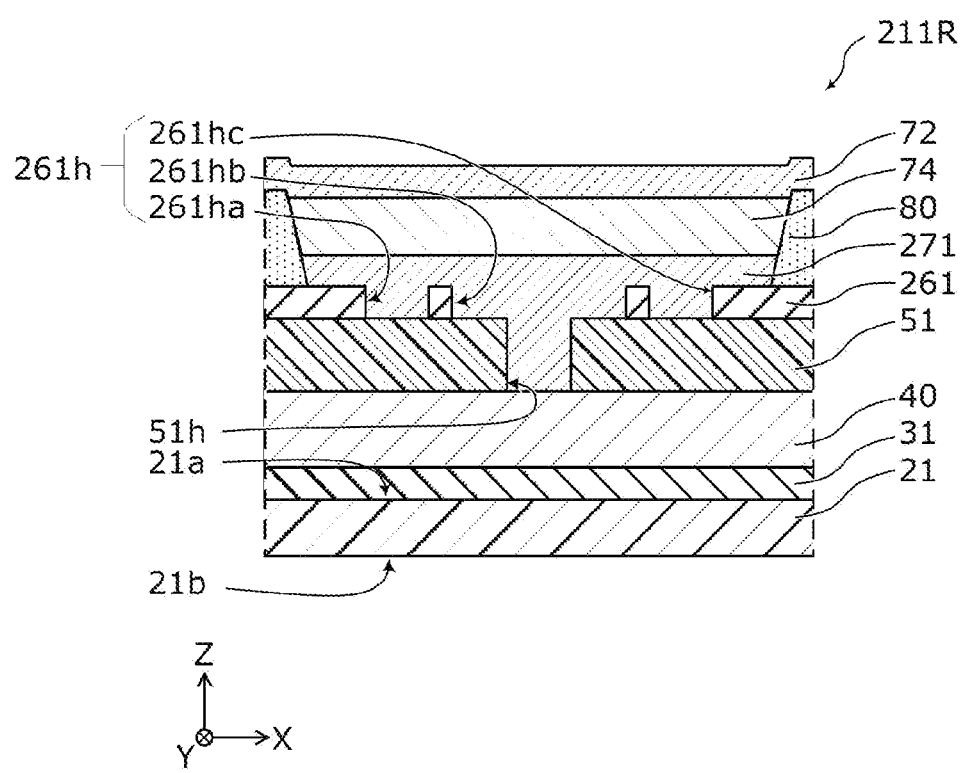
FIG. 7 is a schematic cross-sectional view illustrating a layered structure of the subpixel of the display apparatus according to the third embodiment.

A display apparatus according to a third embodiment will be described. The shape of the first through portion in the display apparatus according to the present embodiment is different from that in the display apparatus 1 according to the first embodiment. The configuration of the display apparatus according to the present embodiment different from the configuration of the display apparatus 1 according to the first embodiment will be mainly described with reference to FIGS. 6 and 7. FIG. 6 is a schematic plan view illustrating an example of a configuration of a subpixel 211R in the display apparatus according to the present embodiment. FIG. 6 illustrates dashed lines representing a contour of a first electrode 271 included in the subpixel 211R and contours of the first through portion 51*h* and a second through portion 261*h*. FIG. 7 is a schematic cross-sectional view illustrating a layered structure of the subpixel 211R of the display apparatus according to the present embodiment. FIG. 7 illustrates a cross section along a line VII-VII in FIG. 6.

As illustrated in FIG. 7, the subpixel 211R according to the present embodiment includes the first substrate 21, the first lower barrier layer 31, the thin film transistor layer 40, the first planarization layer 51, a first barrier layer 261, a first electrode 271, the light emitting layer 74, the second electrode 72, and the bank 80.

The first barrier layer 261 according to the present embodiment is an insulating layer arranged above the first planarization layer 51 and formed from an inorganic material, similarly to the first barrier layer 61 according to the first embodiment. The second through portion 261*h* penetrating the first barrier layer 261 is formed on the first barrier layer 261 according to the present embodiment. The second through portion 261*h* includes a plurality of long through holes 261*ha*, 261*hb*, and 261*hc* extending along the longitudinal direction of the first electrode 271 (that is, Y-axis direction in FIG. 6) as illustrated in FIGS. 6 and 7.

The first electrode 271 according to the present embodiment is a conductive layer arranged above the first barrier layer 261 as illustrated in FIG. 7. Part of the first electrode 271 fills the first through portion 51*h* and the second through portion 261*h*.

As described above, the second through portion 261*h* according to the present embodiment includes the plurality of long through holes 261*ha*, 261*hb*, and 261*hc* extending along the longitudinal direction of the first electrode 271. Therefore, the contact area of the first electrode 271 with the first barrier layer 261 and the first planarization layer 51 can be larger than the contact area of the first electrode 71 with the first barrier layer 61 and the first planarization layer 51 according to the first embodiment. This can increase the adhesion (in other words, bond strength) of the first electrode 271 with the first barrier layer 261 and the first planarization layer 51 and suppress the peeling-off of the first electrode 271. Note that part of the plurality of through holes included in the second through portion 261*h* may not be connected to the first through portion 51*h*. In the present embodiment, the through hole 261*hb* is connected to the first through portion 51*h*, and the through holes 261*ha* and 261*hc* are not connected to the first through portion 51*h*.

The through holes 261*ha*, 261*hb*, and 261*hc* extend along the longitudinal direction of the first electrode 271. Parts of the upper surface of the first electrode 271 positioned above the through holes may be slightly depressed. That is, depressions extending along the longitudinal direction of the first electrode 271 may be formed on the upper surface of the first electrode 271. In forming the light emitting layer 74 on the upper surface of the first electrode 271 by using the inkjet application method, the solution as an ingredient of the light emitting layer 74 may not be applied to parts of the depressions when the solution is applied along a direction crossing the longitudinal direction of the depressions.

In the present embodiment, the through holes extend along the longitudinal direction of the first electrode 271, and the depressions also extend along the longitudinal direction of the first electrode 271. In general, the solution is applied along the longitudinal direction of the subpixel 211R, that is, the longitudinal direction of the first electrode 271, and therefore, the solution is applied along the longitudinal direction of the depressions in forming the light emitting layer 74 according to the present embodiment. This can reduce interruption of the application of the solution at the depressions. Therefore, the uniformity in the film thickness of the light emitting layer 74 can be increased.

Fourth Embodiment

Figure 8:
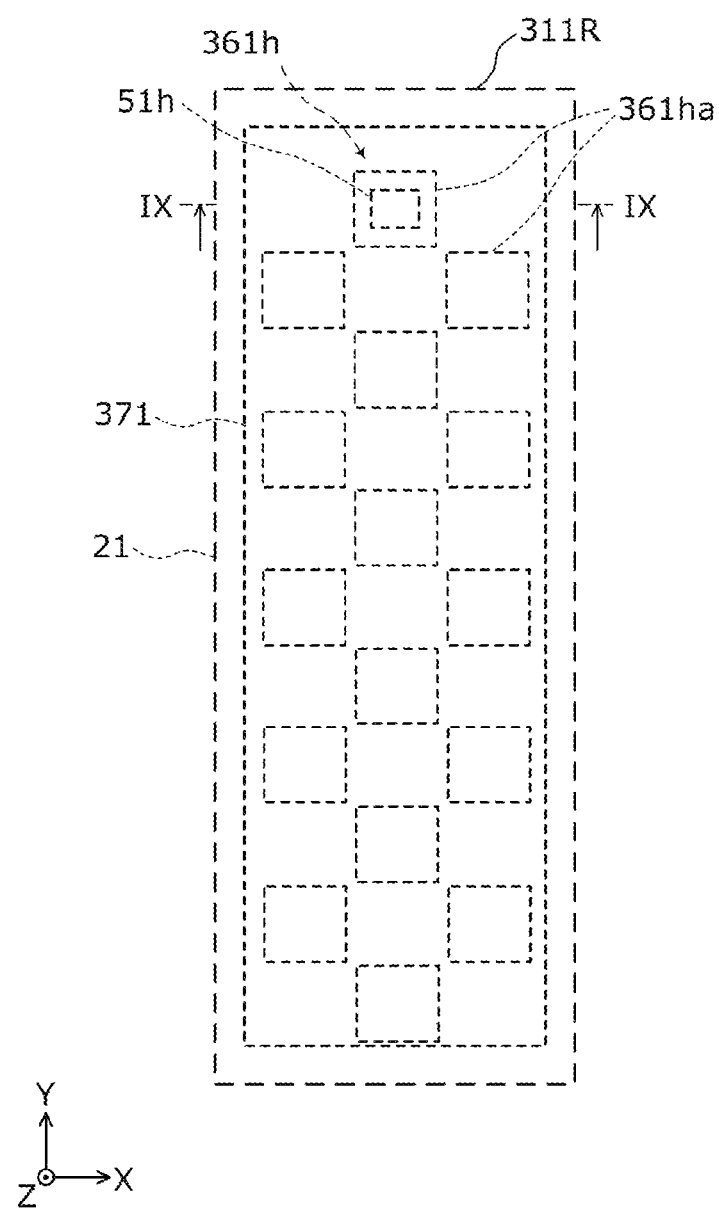
FIG. 8 is a schematic plan view illustrating an example of a configuration of a subpixel in a display apparatus according to a fourth embodiment.
Figure 9:
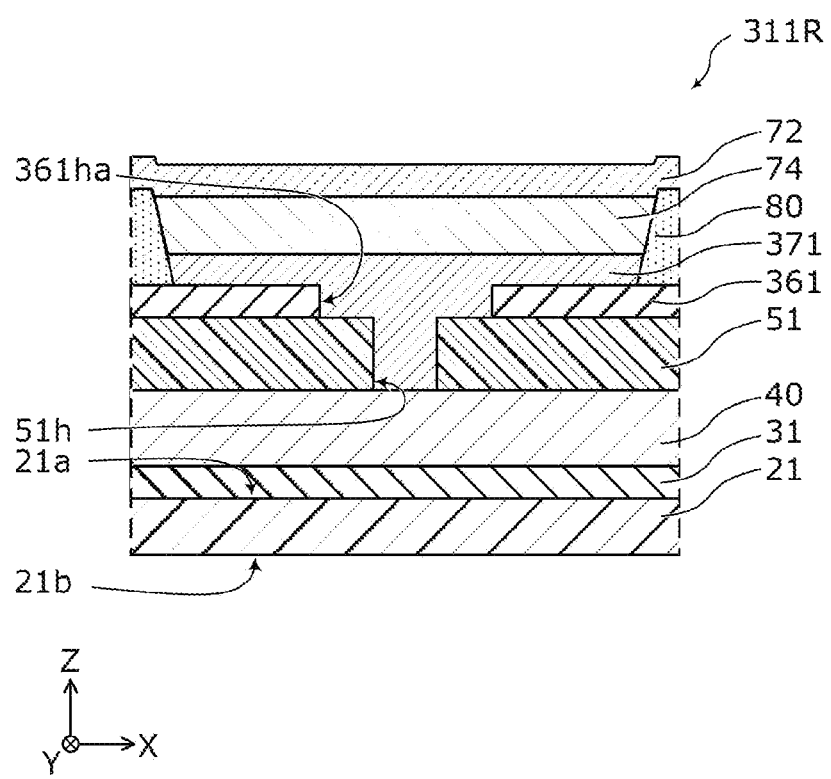
FIG. 9 is a schematic cross-sectional view illustrating a layered structure of the subpixel of the display apparatus according to the fourth embodiment.

A display apparatus according to a fourth embodiment will be described. The shape of the first through portion in the display apparatus according to the present embodiment is different from that in the display apparatus 1 according to the first embodiment. The configuration of the display apparatus according to the present embodiment different from the configuration of the display apparatus 1 according to the first embodiment will be mainly described with reference to FIG. 8. FIG. 8 is a schematic plan view illustrating an example of a configuration of a subpixel 311R in the display apparatus according to the present embodiment. FIG. 8 illustrates dashed lines representing a contour of a first electrode 371 included in the subpixel 311R and contours of the first through portion 51h and a second through portion 361h. FIG. 9 is a schematic cross-sectional view illustrating a layered structure of the subpixel 311R of the display apparatus according to the present embodiment. FIG. 9 illustrates a cross section along a line IX-IX in FIG. 8.

As illustrated in FIG. 9, the subpixel 311R according to the present embodiment includes the first substrate 21, the first lower barrier layer 31, the thin film transistor layer 40, the first planarization layer 51, a first barrier layer 361, the first electrode 371, the light emitting layer 74, the second electrode 72, and the bank 80.

The first barrier layer 361 according to the present embodiment is an insulating layer arranged above the first planarization layer 51 and formed from an inorganic material, similarly to the first barrier layer 61 according to the first embodiment. The second through portion 361h penetrating the first barrier layer 361 is formed on the first barrier layer 361 according to the present embodiment. The second through portion 361h includes a plurality of through holes 361ha arranged in a staggered pattern as illustrated in FIGS. 8 and 9.

The first electrode 371 according to the present embodiment is a conductive layer arranged above the first barrier layer 361 as illustrated in FIG. 9. Part of the first electrode 371 fills the first through portion 51h and the second through portion 361h.

As described above, the second through portion 361h according to the present embodiment includes the plurality of through holes 361ha arranged in a staggered pattern. As a result, the contact area of the first electrode 371 with the first barrier layer 361 and the first planarization layer 51 can be larger than the contact area of the first electrode 71 with the first barrier layer 61 and the first planarization layer 51 according to the first embodiment. This can increase the adhesion (in other words, bond strength) of the first electrode 371 with the first barrier layer 361 and the first planarization layer 51 and suppress the peeling-off of the first electrode 371.

Fifth Embodiment

Figure 10:
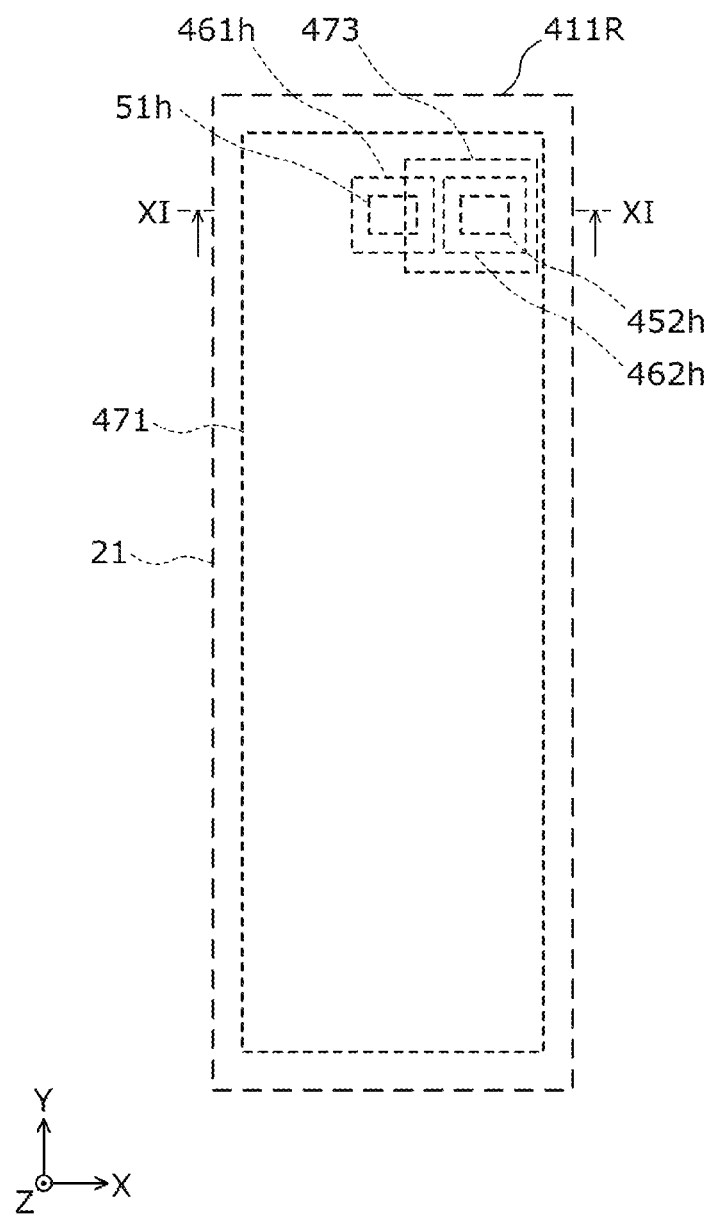
FIG. 10 is a schematic plan view illustrating an example of a configuration of a subpixel in a display apparatus according to a fifth embodiment.
Figure 11:
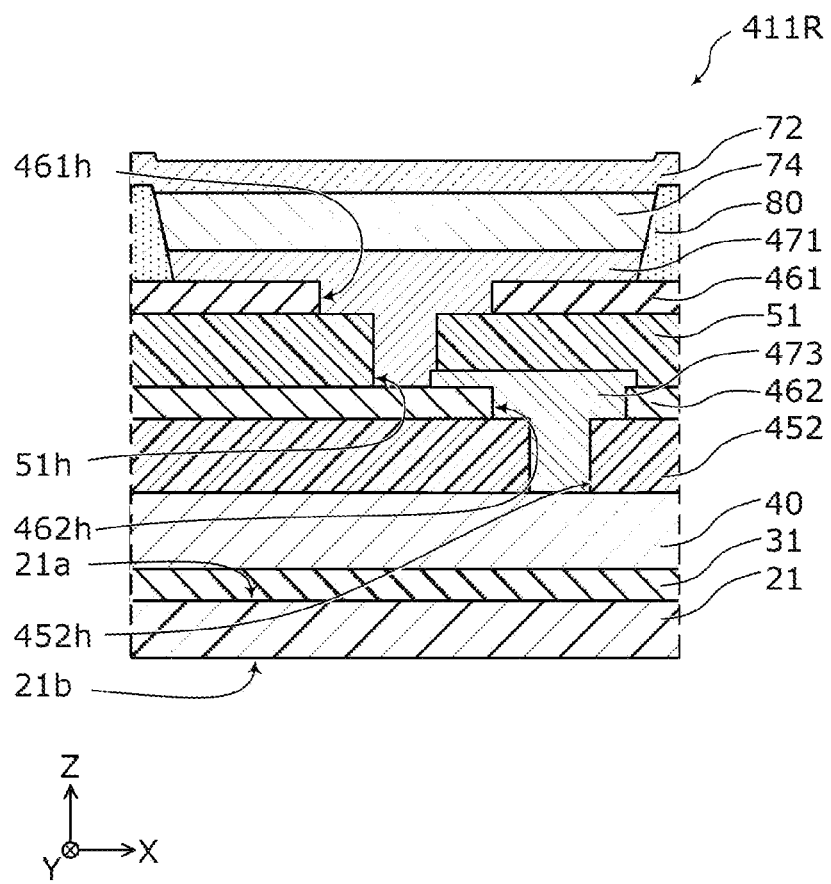
FIG. 11 is a schematic cross-sectional view illustrating a layered structure of the subpixel of the display apparatus according to the fifth embodiment.

A display apparatus according to a fifth embodiment will be described. The display apparatus according to the present embodiment is mainly different from the display apparatus 1 according to the first embodiment in that the display apparatus further includes another barrier layer above the thin film transistor layer 40 in addition to the first barrier layer 61. The configuration of the display apparatus according to the present embodiment different from the configuration of the display apparatus 1 according to the first embodiment will be mainly described with reference to FIGS. 10 and 11. FIG. 10 is a schematic plan view illustrating an example of a configuration of a subpixel 411R in the display apparatus according to the present embodiment. FIG. 10 illustrates dashed lines representing contours of a first electrode 471 and a relay electrode 473 included in the subpixel 411R and contours of the first through portion 51h, a second through portion 461h, a third through portion 452h, and a fourth through portion 462h. FIG. 11 is a schematic cross-sectional view illustrating a layered structure of the subpixel 411R of the display apparatus according to the present embodiment. FIG. 11 illustrates a cross section along a line XI-XI in FIG. 10.

As illustrated in FIG. 11, the subpixel 411R according to the present embodiment includes the first substrate 21, the first lower barrier layer 31, the thin film transistor layer 40, the first planarization layer 51, a first barrier layer 461, the first electrode 471, the light emitting layer 74, the second electrode 72, and the bank 80. In the present embodiment, the subpixel 411R further includes a second planarization layer 452, a second barrier layer 462, and the relay electrode 473.

The first barrier layer 461 according to the present embodiment is an insulating layer arranged above the first planarization layer 51 and formed from an inorganic material, similarly to the first barrier layer 61 according to the first embodiment. The second through portion 461h penetrating the first barrier layer 461 is formed on the first barrier layer 461 according to the present embodiment. In the present embodiment, the area of the second through portion 461h may not be equal to or greater than 30% of the area of the first electrode 471 in plan view of the main surface 21a of the first substrate 21 as illustrated in FIG. 10.

The first electrode 471 according to the present embodiment is a conductive layer arranged above the first barrier layer 461 as illustrated in FIG. 11. Part of the first electrode 471 fills the first through portion 51h and the second through portion 461h.

The second planarization layer 452 is an insulating layer arranged between the thin film transistor layer 40 and the first planarization layer 51 and formed from an organic material. The third through portion 452h penetrating the second planarization layer 452 is formed on the second planarization layer 452. The second planarization layer 452 is formed from, for example, a polyimide resin of fluorinated polyimide, an acrylic resin, or other organic material.

The second barrier layer 462 is an insulating layer arranged between the second planarization layer 452 and the first planarization layer 51 and formed from an inorganic material. An inorganic material film, such as silicon oxide, silicon nitride, and aluminum oxide, can be used for the second barrier layer 462. The second barrier layer 462 suppresses infiltration of moisture from the second planarization layer 452 and layers below the second planarization layer 452 to the light emitting layer 74.

The fourth through portion 462h penetrating the second barrier layer 462 and at least partially connected to the third through portion 452h is formed on the second barrier layer 462. In this way, although the fourth through portion 462h is formed on the second barrier layer 462, part of the relay electrode 473 described later fills the fourth through portion 462h, and this can suppress the infiltration of moisture into the light emitting layer 74 through the fourth through portion 462h. In addition, at least part of the fourth through portion 462h is arranged at a position different from that of the second through portion 461h in plan view of the main surface 21a of the first substrate 21.

The relay electrode 473 is a conductive layer arranged between the second barrier layer 462 and the first planarization layer 51. In the present embodiment, the relay electrode 473 is electrically connected to the conductive layer included in the thin film transistor layer 40 through the third through portion 452h and the fourth through portion 462h. In this way, the third through portion 452h and the fourth through portion 462h function as contact holes. The relay electrode 473 is formed from, for example, a metal material, such an Ag alloy and Al. The relay electrode 473 is also arranged on the third through portion 452h and the fourth through portion 462h. In other words, part of the relay electrode 473 fills the third through portion 452h and the fourth through portion 462h. The relay electrode 473 is electrically connected to the first electrode 471 at the first through portion 51h. Therefore, the first electrode 471 is electrically connected to the conductive layer included in the thin film transistor layer 40 through the relay electrode 473.

In this way, the display apparatus according to the present embodiment includes the second barrier layer 462 in addition to the first barrier layer 461. The relay electrode 473 fills the fourth through portion 462h formed on the second barrier layer 462, and this can suppress the infiltration of moisture from the second planarization layer 452 to the light emitting layer 74 through the fourth through portion 462h. As a result, even when there is a crack etc. on one of the first barrier layer 461 and the second barrier layer 462, the other barrier layer can suppress the infiltration of moisture from the second planarization layer 452 to the light emitting layer 74. This can more surely suppress the infiltration of moisture into the light emitting layer 74.

As for the manufacturing method of the display apparatus according to the present embodiment, the second planarization layer 452, the second barrier layer 462, and the relay electrode 473 can be manufactured as in the manufacturing method of the first planarization layer 51, the first barrier layer 61, and the first electrode 71 according to the first embodiment. The second planarization layer 452 near the fourth through portion 462h is heated when the relay electrode 473 is formed. Accordingly, gas is generated from the second planarization layer 452 near the fourth through portion 462h. The generated gas is confined by the second barrier layer 462 and the relay electrode 473, and stress is generated on the second barrier layer 462 near the fourth through portion 462h.

However, at least part of the fourth through portion 462h is arranged at a position different from that of the second through portion 461h in plan view of the main surface 21a of the first substrate 21 in the present embodiment. Therefore, the location of the stress is dispersed to a portion near the fourth through portion 462h and to a portion near the second through portion 461h, and the stress can be dispersed more than when the fourth through portion 462h and the second through portion 461h are formed on the same position in plan view of the main surface 21a of the first substrate 21. This can suppress the peeling and cracking of the first barrier layer 461 and the second barrier layer 462 caused by the stress.

Sixth Embodiment

Figure 12:
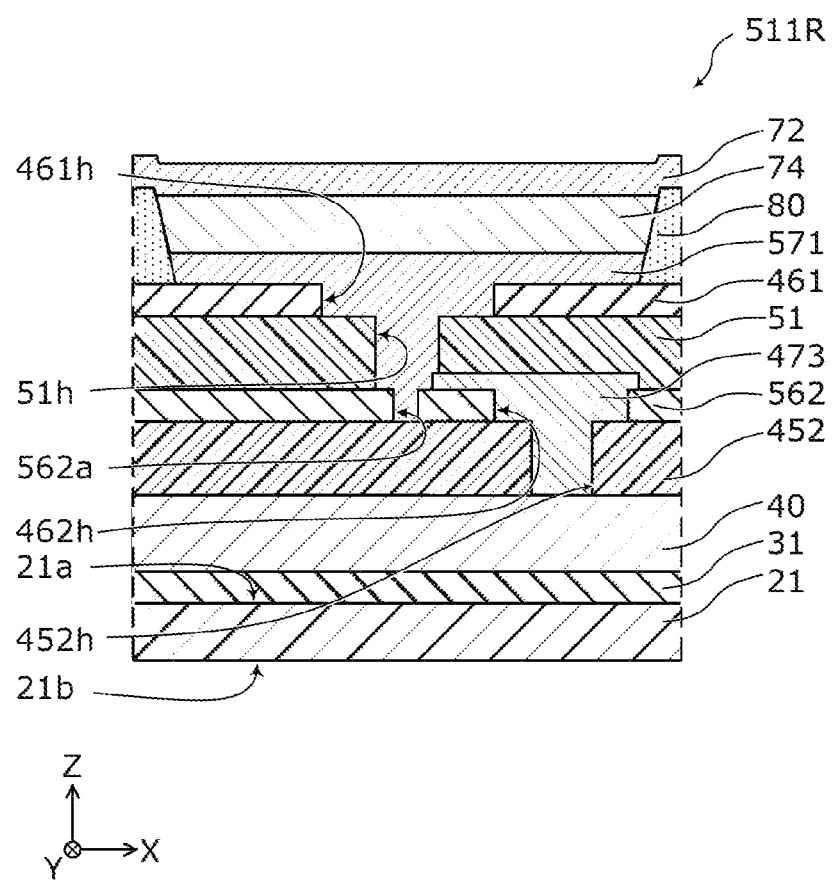
FIG. 12 is a schematic cross-sectional view illustrating a layered structure of a subpixel of a display apparatus according to a sixth embodiment.

A display apparatus according to a sixth embodiment will be described. The display apparatus according to the present embodiment is different from the display apparatus according to the fifth embodiment in that a through portion that discharges gas generated from a second planarization layer is formed on a second barrier layer. The configuration of the display apparatus according to the present embodiment different from the configuration of the display apparatus according to the fifth embodiment will be mainly described with reference to FIG. 12. FIG. 12 is a schematic cross-sectional view illustrating a layered structure of a subpixel 511R of the display apparatus according to the present embodiment.

As illustrated in FIG. 12, the subpixel 511R according to the present embodiment includes the first substrate 21, the first lower barrier layer 31, the thin film transistor layer 40, the first planarization layer 51, the first barrier layer 461, the second planarization layer 452, a second barrier layer 562, the relay electrode 473, a first electrode 571, the light emitting layer 74, the second electrode 72, and the bank 80, similarly to the subpixel 411R according to the fifth embodiment.

The second barrier layer 562 according to the present embodiment is an insulating layer arranged between the second planarization layer 452 and the first planarization layer 51 and formed from an inorganic material. The fourth through portion 462h penetrating the second barrier layer 562 and at least partially connected to the third through portion 452h is formed on the second barrier layer 562. In the present embodiment, a fifth through portion 562a that is arranged below the first through portion 51h, penetrates the second barrier layer 562, but is not provided with the relay electrode 473 is formed on the second barrier layer 562.

An effect of the fifth through portion 562a according to the present embodiment will be described. The fifth through portion 562a is formed, for example, before the relay electrode 473 is formed. Specifically, after the second barrier layer 562 is formed, a photolithography method, an etching method, or other method is used to form the fifth through portion 562a at the same time as the fourth through portion 462h. The relay electrode 473 is then formed. The relay electrode 473 fills the third through portion 452h and the fourth through portion 462h, but the relay electrode 473 is not formed on the fifth through portion 562a. The second planarization layer 452 near the fourth through portion 462h is heated when the relay electrode 473 is formed. Accordingly, gas is generated from the second planarization layer 452 near the fourth through portion 462h. The fifth through portion 562a is formed in the present embodiment, and therefore, at least part of the generated gas is discharged through the fifth through portion 562a. This can reduce the stress caused by the gas generated when the relay electrode 473 is formed.

Note that the first electrode 571 fills the fifth through portion 562a, and this can suppress the infiltration of moisture from the second planarization layer 452 to the light emitting layer 74 through the fifth through portion 562a. The area of the fifth through portion 562a may be smaller than the area of the fourth through portion 462h in plan view of the main surface 21a of the first substrate 21. This can suppress the heating of the second planarization layer 452 when the first electrode 571 fills the fifth through portion 562a. Therefore, the gas generated in the second planarization layer 452 can be reduced, and the stress generated in the second barrier layer 562 can be reduced. In this way, the present embodiment can suppress the infiltration of moisture from the second planarization layer 452 to the light emitting layer 74 and suppress the stress generated in the second barrier layer 562. This can further suppress the peeling and cracking of the second barrier layer 562.

OTHER EMBODIMENTS

Although the display apparatus according to the embodiments of the present disclosure has been described, the display apparatus is not limited to the embodiments. Other embodiments realized by combining optional constituent elements in the embodiments, modifications obtained by modifying the embodiments in various ways conceived by those skilled in the art without departing from the scope of the present disclosure, and various devices including the processing circuits etc. according to the embodiments are also included in the present disclosure.

For example, the second substrate 122 and the second lower barrier layer 132 according to the second embodiment may be applied to the display apparatus according to the third to sixth embodiments.

The area of the second through portion 461h may be equal to or greater than 30% of the area of the first electrode 471 or 571 in plan view of the main surface 21a of the first substrate 21 in the display apparatuses according to the fifth and sixth embodiments.

Although the pixel includes three subpixels in the embodiments, the number of subpixels included in the pixel may be any number equal to or greater than one. For example, the pixel may include four subpixels corresponding to emission colors of R, G, B, and W (white).

The present disclosure is useful for, for example, a flexible organic EL flat panel display.

What is claimed is:

1. A display apparatus comprising:
   a flexible first substrate;
   a first lower barrier layer arranged above one main surface of the flexible first substrate and formed from an inorganic material;
   a thin film transistor layer arranged above the first lower barrier layer and including a thin film transistor;
   a first planarization layer arranged above the thin film transistor layer and formed from an organic material;
   a first barrier layer arranged above the first planarization layer and formed from the inorganic material;
   a first electrode arranged above the first barrier layer;
   a second electrode arranged above the first electrode; and
   a light emitting layer arranged between the first electrode and the second electrode and supplied with current through the first electrode and the second electrode to emit light, wherein
   a first through portion penetrating the first planarization layer is formed on the first planarization layer,
   a second through portion penetrating the first barrier layer and at least partially connected to the first through portion is formed on the first barrier layer,
   part of the first electrode fills the first through portion and the second through portion, and
   an area of the second through portion is equal to or greater than 30% of an area of the first electrode in plan view of the main surface of the flexible first substrate.

2. The display apparatus according to claim 1, wherein the second through portion includes a plurality of long through holes extending along a longitudinal direction of the first electrode in plan view of the main surface of the flexible first substrate.

3. The display apparatus according to claim 1, wherein the second through portion includes a plurality of through holes arranged in a staggered pattern in plan view of the main surface of the flexible first substrate.

4. The display apparatus according to claim 1, further comprising:
   a flexible second substrate arranged between the first lower barrier layer and the thin film transistor layer; and
   a second lower barrier layer arranged between the second substrate and the thin film transistor layer and formed from the inorganic material.

5. A display apparatus comprising:
   a flexible first substrate;
   a first lower barrier layer arranged above one main surface of the flexible first substrate and formed from an inorganic material;
   a thin film transistor layer arranged above the first lower barrier layer and including a thin film transistor;
   a first planarization layer arranged above the thin film transistor layer and formed from an organic material;
   a first barrier layer arranged above the first planarization layer and formed from the inorganic material;
   a first electrode arranged above the first barrier layer;
   a second electrode arranged above the first electrode;
   a light emitting layer arranged between the first electrode and the second electrode and supplied with current through the first electrode and the second electrode to emit light;
   a second planarization layer arranged between the thin film transistor layer and the first planarization layer and formed from an organic material;
   a second barrier layer arranged between the second planarization layer and the first planarization layer and formed from the inorganic material; and
   a relay electrode arranged between the second barrier layer and the first planarization layer, wherein
   a first through portion penetrating the first planarization layer is formed on the first planarization layer,
   a second through portion penetrating the first barrier layer and at least partially connected to the first through portion is formed on the first barrier layer,
   a third through portion penetrating the second planarization layer is formed on the second planarization layer, a fourth through portion penetrating the second barrier layer and at least partially connected to the third through portion is formed on the second barrier layer, part of the first electrode fills the first through portion and the second through portion, part of the relay electrode fills the third through portion and the fourth through portion, at least part of the fourth through portion is arranged at a position different from that of the second through portion in plan view of the main surface of the flexible first substrate, and the relay electrode is electrically connected to the first electrode at the first through portion.

6. The display apparatus according to claim 5, wherein a fifth through portion arranged below the first through portion, penetrating the second barrier layer, and not provided with the relay electrode is formed on the second barrier layer.

* * * * *